United States Patent
Kim et al.

(10) Patent No.: US 11,545,344 B2
(45) Date of Patent: Jan. 3, 2023

(54) UPPER ELECTRODE AND SUBSTRATE PROCESSING APPARATUS INCLUDING THE SAME

(71) Applicant: SAMSUNG ELECTRONICS CO., LTD., Suwon-si (KR)

(72) Inventors: Byungjo Kim, Seoul (KR); Sangki Nam, Seongnam-si (KR); Jungmin Ko, Seoul (KR); Kwonsang Seo, Suwon-si (KR); Seungbo Shim, Seoul (KR); Younghyun Jo, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/188,064

(22) Filed: Mar. 1, 2021

(65) Prior Publication Data

US 2022/0051877 A1     Feb. 17, 2022

(30) Foreign Application Priority Data

Aug. 14, 2020 (KR) .................. 10-2020-0102156

(51) Int. Cl.
*H01J 37/32* (2006.01)

(52) U.S. Cl.
CPC .. *H01J 37/32541* (2013.01); *H01J 37/32642* (2013.01); *H01J 37/32715* (2013.01)

(58) Field of Classification Search
CPC ......... H01J 37/32541; H01J 37/32568; H01J 37/32642; H01J 37/32706; H01J 37/32715; H01J 2237/3321; H01J 2237/3341; H01J 2237/335; H01L 21/67028; H01L 21/67069

See application file for complete search history.

(56) References Cited

U.S. PATENT DOCUMENTS

| | | | |
|---|---|---|---|
| 8,097,082 B2 | 1/2012 | Zhou et al. | |
| 10,358,721 B2 | 7/2019 | Kim et al. | |
| 10,553,404 B2 | 2/2020 | Luere et al. | |
| 10,615,003 B2 | 4/2020 | Kellogg et al. | |
| 2005/0022934 A1 | 2/2005 | Kwon et al. | |
| 2013/0014895 A1* | 1/2013 | Kawamata | H01J 37/3244 156/345.33 |
| 2015/0232993 A1* | 8/2015 | Iwao | H01J 37/32192 118/723 AN |
| 2017/0069470 A1* | 3/2017 | Murakami | H01J 37/32091 |
| 2019/0148119 A1 | 5/2019 | Sung et al. | |
| 2019/0244793 A1 | 8/2019 | Chen et al. | |
| 2019/0382894 A1* | 12/2019 | Kato | C23C 16/45536 |

FOREIGN PATENT DOCUMENTS

KR     1020090103751 A     10/2009

* cited by examiner

*Primary Examiner* — Haissa Philogene
(74) *Attorney, Agent, or Firm* — Sughrue Mion, PLLC

(57) ABSTRACT

An upper electrode used for a substrate processing apparatus using plasma is provided. The upper electrode includes a bottom surface including a center region and an edge region having a ring shape and surrounding the center region, a first protrusion portion protruding toward plasma from the edge region and having a ring shape, wherein the first protrusion portion includes a first apex corresponding to a radial local maximum point toward the plasma, and a first distance, which is a radial-direction distance between the first apex and a center axis of the upper electrode, is greater than a radius of a substrate.

19 Claims, 12 Drawing Sheets

UPPER ELECTRODE AND SUBSTRATE PROCESSING APPARATUS INCLUDING THE SAME

CROSS-REFERENCE TO RELATED APPLICATION

This application is based on and claims priority under 35 U.S.C. § 119 to Korean Patent Application No. 10-2020-0102156, filed on Aug. 14, 2020, in the Korean Intellectual Property Office, the disclosure of which is incorporated by reference herein in its entirety.

BACKGROUND

Embodiments relate to an upper electrode and a substrate processing apparatus including the same, and more particularly, to an upper electrode for performing plasma treatment on a substrate and a substrate processing apparatus including the upper electrode.

Examples of a process of manufacturing semiconductor devices include a plasma process including a plasma-induced deposition process, a plasma etching process, and a plasma cleaning process. Recently, as the need for miniaturized and highly-integrated semiconductor devices increases, it is required to form a contact structure, having a high aspect ratio which is tens to hundreds times higher than a general aspect ratio, on a wafer. In a process of forming a structure having a high aspect ratio, a fine error of the plasma process may cause defects of each semiconductor product. Therefore, various researches are being continuously performed for accurately controlling a density distribution of plasma in plasma equipment to enhance the precision and reliability of the plasma process.

SUMMARY

Embodiments provide an upper electrode for performing plasma treatment having enhanced reliability and a substrate processing apparatus including the upper electrode.

In an embodiment provided herein, provided is an upper electrode used for a substrate processing apparatus using plasma, the upper electrode including: a bottom surface including a center region and an edge region, the edge region having a ring shape and surrounding the center region; and a first protrusion portion protruding toward the plasma from the edge region and having a ring shape, wherein the first protrusion portion includes a first apex corresponding to a local maximum thickness of the upper electrode in a vertical direction toward the plasma, the bottom surface configured to face a substrate with the plasma between, and a first distance, which is a first radial-direction distance between the first apex and a center axis of the upper electrode, is greater than a radius of the substrate.

In another embodiment provided herein, provided is an upper electrode used for a substrate processing apparatus, the upper electrode including a bottom surface configured to face a substrate processed by the substrate processing apparatus, wherein the bottom surface includes a first protrusion portion having a ring shape, the first protrusion portion includes a first apex corresponding to a local maximum thickness of the upper electrode in a vertical direction, the bottom surface facing the substrate, a first distance, which is a distance between the first apex and a center axis of the upper electrode, is beginning at and including 150 mm and extending to and including 180 mm, the bottom surface further including a point of minimum thickness corresponding to a radial local minimum point, and the point of minimum thickness occurs between the center axis and the first protrusion portion.

In yet another embodiment provided herein, provided is an upper electrode used for a substrate processing apparatus, the upper electrode including: a first portion configured to face a substrate; and a second portion configured to face a focus ring, the second portion surrounding the first portion, wherein the second portion is recessed in a direction from a bottom surface of the upper electrode toward a top surface of the upper electrode.

Also provided herein is a substrate processing apparatus including: a wafer supporter configured to support a substrate; a focus ring configured to surround an outer perimeter of the substrate; an upper electrode disposed apart from the wafer supporter in a first direction, wherein the first direction is a vertical direction perpendicular to a plane including a top surface of the substrate; and a shroud surrounding the upper electrode and the wafer supporter, wherein the upper electrode includes: a first electrode configured to face the substrate; and a second electrode configured to face the focus ring, the second electrode surrounding the first electrode and extending beyond the focus ring in a radial direction with respect to a center axis of the upper electrode, wherein a bottom surface of the second electrode is recessed in a direction from the bottom surface of the second electrode toward a top surface of the second electrode.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Hereinafter, embodiments will be described in detail with reference to the accompanying drawings. Like numeral references refer to like elements, and their repetitive descriptions are omitted.

Figure 1:
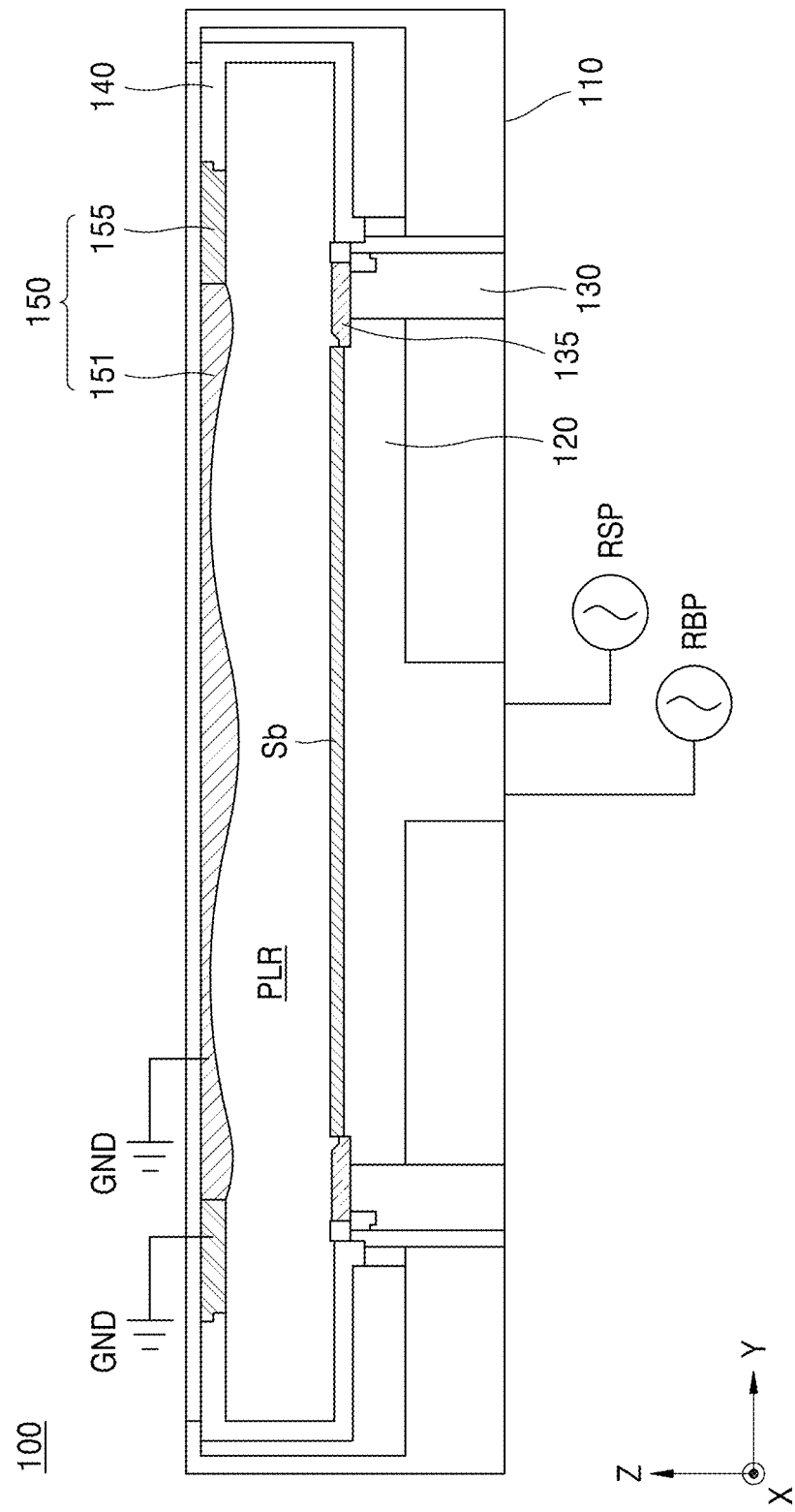
FIG. 1 is a cross-sectional view for describing a substrate processing apparatus according to embodiments.

FIG. 1 is a cross-sectional view for describing a substrate processing apparatus 100 according to embodiments.

Referring to FIG. 1, the substrate processing apparatus 100 may include a chamber 110, a substrate supporter 120, a focus ring supporter 130, a focus ring 135, a shroud 140, and an upper electrode 150.

The substrate processing apparatus 100 may perform plasma treatment on a substrate Sb. The substrate processing apparatus 100 may perform one of an ion beam etching process based on plasma, a material film deposition process based on plasma, and an ion cleaning process based on plasma on the substrate Sb. Hereinafter, an embodiment where the substrate processing apparatus 100 performs an ion beam etching process based on plasma will be mainly described. However, those of ordinary skill in the art may easily implement an embodiment where the substrate processing apparatus 100 performs an ion cleaning process based on plasma and a deposition process based on plasma, based on description given herein.

The substrate Sb may include, for example, silicon (Si). The substrate Sb may include a semiconductor element, such as germanium (Ge), or a compound semiconductor such as silicon carbide (SiC), gallium arsenide (GaAs), indium arsenide (InAs), or indium phosphide (InP).

According to some embodiments, the substrate Sb may have a silicon on insulator (SOI) structure. The substrate Sb may include a buried oxide layer formed on a front surface of the substrate Sb. According to some embodiments, the substrate Sb may include a conductive region (for example, an impurity-doped well) formed on the front surface of the substrate Sb. According to some embodiments, the substrate Sb may have various isolation structures such as shallow trench isolation (STI) for isolating the doped well. Although not shown, various material layers and various patterns including different materials may be formed on the front surface of the substrate Sb.

The substrate processing apparatus 100 may correspond to capacitively coupled plasma (CCP) equipment, but is not limited thereto. For example, the substrate processing apparatus 100 may be implemented with arbitrary different suitable equipment such as CCP cathode equipment, inductively coupled plasma (ICP) equipment, transformer coupled plasma (TCP) equipment, and remote microwave plasma generating and transferring equipment.

The chamber 110 may provide an internal space for processing the substrate Sb. The chamber 110 may separate the internal space for processing the substrate Sb from the outside. The chamber 110 may include clean room equipment for adjusting pressure and a temperature at a high precision level. The chamber 110 may provide a space where elements included in the substrate processing apparatus 100 is disposed. A plasma region PLR, where plasma is generated, may be defined in the chamber 110. The chamber 110 may be approximately cylindrical in shape, but is not limited thereto.

The substrate supporter 120 may support the substrate Sb. The substrate supporter 120 may include an electrostatic chuck which fixes the substrate Sb by using an electrostatic force, but is not limited thereto. The substrate supporter 120 may include an internal heating wire structure for controlling a temperature of the substrate Sb.

Radio frequency (RF) source power RSP for generating plasma and RF bias power RBP for accelerating the generated plasma may be applied to the substrate supporter 120. The RF source power RSP may have a frequency of tens MHz (for example, 60 MHz, 40 MHz, etc.), and the RF bias power RBP may have a frequency of hundreds kHz to several MHz (for example, 400 kHz, 2 MHz, etc.).

The focus ring supporter 130 may be disposed adjacent to the substrate supporter 120. The focus ring supporter 130 may support the focus ring 135 and may surround an outer periphery of the substrate supporter 120.

The focus ring 135 may surround the outer periphery of the substrate Sb. The focus ring 135 may limit plasma to a space on the substrate Sb, optimize the performance of processing an edge of the substrate Sb, and protect the substrate supporter 120 from damage caused by plasma and/or the like.

The shroud 140 may limit the plasma region PLR to an inner portion of the space on the substrate Sb. The shroud 140 may surround an outer perimeter of each of the substrate supporter 120 and the upper electrode 150. In an embodiment, the shroud 140 may include a C-shroud. The shroud 140 may include a semiconductor material such as Si and polysilicon. The shroud 140 may include at least one slot so that a gas provided to the chamber 110 is vented to the outside of the chamber 110.

According to embodiments, a reference voltage GND may be applied to the upper electrode 150. According to embodiments, the upper electrode 150 may include a gas distribution apparatus, such as a showerhead, which introduces and distributes process gases.

The upper electrode, like the substrate Sb, may have rotational symmetricity, also referred to herein as radial symmetry about a center axis. According to embodiments, the upper electrode 150 may include an internal electrode 151 in a center region and an external electrode 155 surrounding the internal electrode 151.

Hereinafter, a direction of a center axis CX of the upper electrode 150 may be defined as a Z direction, and two directions vertical to the Z direction may be defined as an X direction and a Y direction. The X direction may be vertical to the Y direction. Unless separately described, definition of each direction may be the same as FIG. 1. The Z direction may be referred to as vertical.

The internal electrode 151 may face the substrate Sb and may have a diameter which is greater than that of the substrate Sb. The internal electrode 151 may face the substrate Sb and may have a diameter which is about 1 to 1.2 times a diameter of the substrate Sb. For example, when the diameter of the substrate Sb is about 150 mm, the diameter of the internal electrode 151 may range from about 150 mm to about 180 mm, and when the diameter of the substrate Sb is about 200 mm, the diameter of the internal electrode 151 may range from about 200 mm to about 240 mm. Also, when the diameter of the substrate Sb is about 300 mm, the diameter of the internal electrode 151 may range from about 300 mm to about 360 mm, and when the diameter of the substrate Sb is about 450 mm, the diameter of the internal electrode 151 may range from about 450 mm to about 540 mm. Hereinafter, for convenience of description, an example where the diameter of the substrate Sb is about 300 mm will be described.

Here, a structure of the upper electrode 150 will be described in more detail with reference to FIG. 2.

Figure 2:
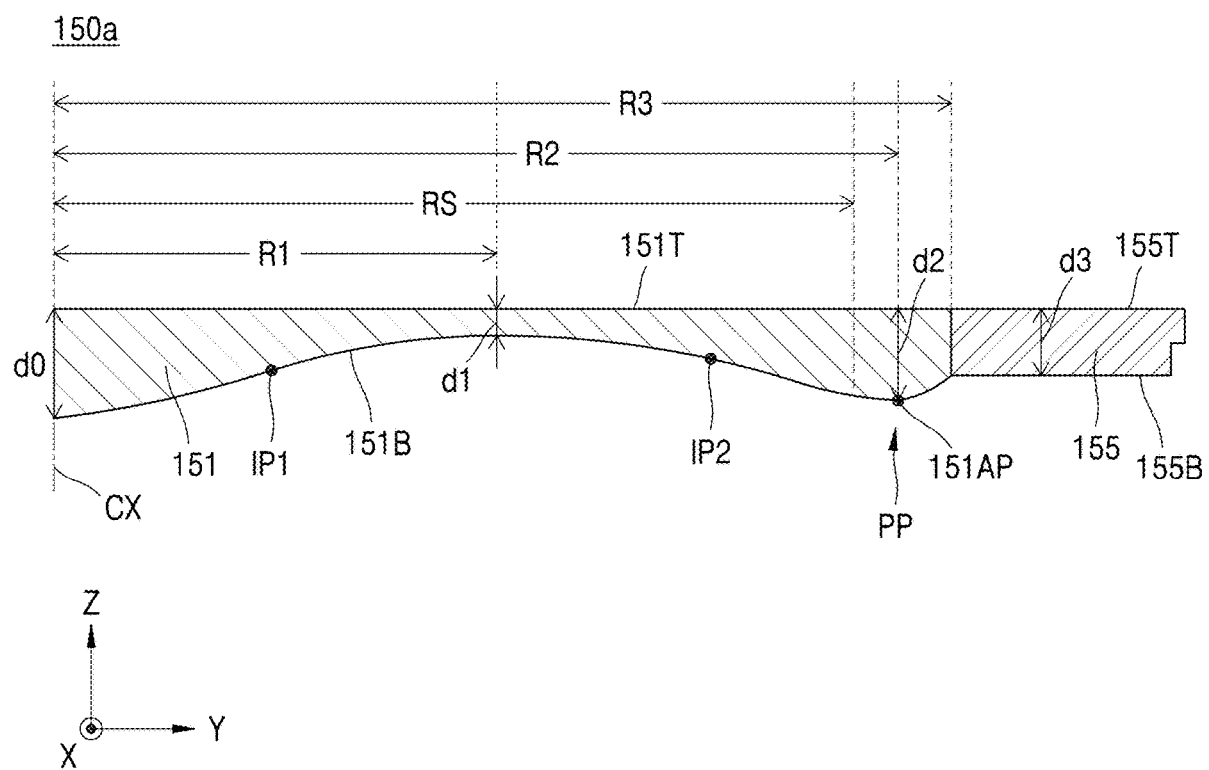
FIG. 2 is a partial cross-sectional view of an upper electrode according to embodiments.

FIG. 2 is a partial cross-sectional view of an upper electrode 150 according to embodiments. The upper electrode 150 may have rotational symmetricity with respect to a center axis CX thereof. Therefore, a description of a portion (i.e., a portion illustrated in FIG. 2) at one side of the center axis CX may be substantially identically applied to a description of a portion (i.e., a portion not illustrated in FIG. 2) at the other side of the center axis CX.

Referring to FIGS. 1 and 2, a planar shape of an internal electrode 151 may be a circular shape, and a planar shape of an external electrode 155 may be a ring shape. In some embodiments, a ring shape exhibits radial symmetry with a central point, thus "ring shape." The external electrode 155 may surround the internal electrode 151. According to embodiments, the external electrode 155 may include a concentric ring which surrounds the internal electrode 151.

The internal electrode 151 may have a thickness which depends on a radial position with respect to a center axis thereof. For example, thickness may vary as function of radius (distance from the center axis). A top surface 151T of the internal electrode 151 may have approximately planar shape, but is not limited thereto. For example, the top surface 151T of the internal electrode 151 may include a concave-convex structure, which is based on a plurality of holes for enabling the internal electrode 151 to operate as a showerhead, and a fastening structure for coupling peripheral elements (for example, the chamber 110).

Here, in a case where the internal electrode 151 is equipped in the chamber 110, a bottom surface 151B of the internal electrode 151 may be a surface facing the substrate Sb, and the top surface 151T of the internal electrode 151 may be an opposite surface of the bottom surface 151B of the internal electrode 151.

An etching speed and etching uniformity of the substrate processing apparatus 100 may be based on, for example, dimensions of elements of the substrate processing apparatus 100. Main elements for affecting the etching speed and etching uniformity of the substrate processing apparatus 100 may include a distance profile between a top surface of the substrate Sb and bottom surfaces 151B and 155B of an upper electrode 150.

The etching speed of the substrate processing apparatus 100 may vary based on a position of a surface of the substrate Sb up to an outer perimeter of the substrate Sb from a center portion of the substrate Sb. Factors causing a change in etching result according to the position on the substrate Sb, may include sheath bending, ion incidence angle tilt, and a radial variation of a plasma density. Since electrons are lighter than ions, they can escape the plasma at a much faster rate than ions if there are no obstacles. Most of the electrons are depleted at a boundary between the plasma and the electrode or the sample, where only cations and neutrals are formed. The boundary where electrons are depleted is called plasma sheath.

The sheath bending and the ion incidence angle tilt may cause tilting of a sidewall of a high aspect ratio etch structure (for example, a contact hole), and the radial variation of the plasma density may cause a radial variation of each of an etching speed and an etch depth.

Elements of the substrate processing apparatus 100 affecting processing of the substrate Sb may include the upper electrode 150 including a showerhead, a plasma limitation shroud 140, the substrate supporter 120 including a baseplate, and the focus ring 135.

When an upper electrode including a flat bottom surface is used for a substrate processing apparatus using plasma, RF source power applied to the substrate processing apparatus may cause a peak of a plasma density in a center region of a substrate, and RF bias power may cause a peak of a plasma density in an edge region (for example, a region of 80 mm to 150 mm from a center of the substrate) of the substrate. Therefore, a plasma density contour including a radial profile having a W-shape may be formed in a plasma region. That a radial profile of the plasma density contour has a W-shape may denote that a concentration of plasma applied to a plasma etching process performed on a substrate is non-uniform.

A non-uniform plasma distribution may cause non-uniform etching performed on a substrate. Recently, as a degree of integration and an aspect ratio of each semiconductor device increase, a tolerance of a profile gradient may be reduced, and due to this, a device defect may occur due to a small gradient which occurs in a sidewall of a high aspect ratio structure. A gradient may refer to a rate of change of plasma density.

The bottom surface 151B of the internal electrode 151 according to embodiments may include a profile based on a radial-direction position thereof. The profile of the bottom surface 151B depending on the radial-direction position may include a geometrical structure and a dimension for uniformly controlling a radial-direction distribution of plasma. A uniformity of a plasma distribution of the plasma region PLR may be enhanced by the profile, based on the radial-direction position, of the bottom surface 151B. According to embodiments, the profile of the bottom surface 151B may continuously vary in all of the bottom surface 151B.

Hereinafter, a variation of the profile of the bottom surface 151B with respect to the top surface 151T will be described in detail. A variation of the profile of the bottom surface 151B with respect to the top surface 151T described below, may also be similarly applied to an arbitrary plane with a center axis CX as a normal line thereof and at the same side as the upper surface 151T. Here, a plane disposed at the same side as the top surface 151T may denote a plane between the top surface 151T and the bottom surface 151B or a plane which is apart from the bottom surface 151B with the top surface 151T therebetween.

A height of the bottom surface 151B from a reference surface may be based on a radial position with respect to the center axis CX of the internal electrode 151. The bottom surface 151B may be farthest away from the reference surface (for example, the top surface 151T) with respect to a center of the internal electrode 151. Therefore, a center thickness d0 of the internal electrode 151 may be a maximum thickness of the internal electrode 151.

The bottom surface 151B may be closer to the reference surface (for example, the top surface 151T) from the center axis CX to a first radius R1 of the internal electrode 151. A distance between the bottom surface 151B and the reference surface (for example, the top surface 151T) may be shortest at the first radius R1. The first radius R1 may be a local minimum point of a height (i.e., a Z-direction distance) of the bottom surface 151B with respect to the top surface 151T.

A thickness of the internal electrode 151 may decrease from the center of the internal electrode 151 to the first radius R1. The internal electrode 151 may have a first thickness d1, which is a minimum thickness at the first radius R1. A thickness of a portion of the internal electrode 151 between the center axis CX of the internal electrode 151 and the first radius R1, may be greater than the first thickness d1 and less than the center thickness d0 of the internal electrode 151. According to embodiments, the first radius R1 may be less than a radius RS of the substrate Sb. According to embodiments, the first radius R1 may range from about 60 mm to about 120 mm, but is not limited thereto.

The bottom surface 151B may be farther away from the reference surface (for example, the top surface 151T) from the first radius R1 of the internal electrode 151 to a second radius R2 of the internal electrode 151. The second radius R2 may be a local maximum point of the height (i.e., the Z-direction distance) of the bottom surface 151B with respect to the top surface 151T. The local maximum point may be defined as an apex 151Ap, and the apex 151Ap may have a ring shape corresponds to a circumference of the second radius R2. According to embodiments, a radial gradient of the bottom surface 151B near the apex 151Ap may continuously vary. For example, a slope of the bottom surface as measured in a radial direction may vary in a smooth way. Therefore, a uniformity of a plasma density distribution in the plasma region PLR may be more enhanced. According to embodiments, a radial gradient of a profile of the bottom surface 151B near the apex 151Ap may be close to 0. According to embodiments, a radial gradient of a profile of the bottom surface 151B at the apex 151Ap may be 0, but is not limited thereto.

A thickness of the internal electrode 151 may increase from the first radius R1 to the second radius R2. The internal electrode 151 may have a second thickness d2 at the second radius R2. A thickness of a portion of the internal electrode 151 between the first radius R1 and the second radius R2 may be greater than the first thickness d1 and less than the second thickness d2.

According to embodiments, the second radius R2 may be greater than the radius RS of the substrate Sb. According to embodiments, the second radius R2 may be within a range which is 1 to 1.2 times the radius RS of the substrate Sb. According to embodiments, the second radius R2 may range from about 150 mm to about 180 mm, but is not limited thereto. According to embodiments, the second radius R2 may range from about 160 mm to about 175 mm, but is not limited thereto. According to embodiments, the apex 151Ap may overlap the focus ring 135 in a Z direction.

According to embodiments, the internal electrode 151 may be provided where the apex 151Ap of the bottom surface 151B is within a range which is 1 to 1.2 times the radius RS of the substrate Sb, and thus, the etching performance of a high aspect ratio hole of the substrate processing apparatus 100 may be enhanced. Here, the etching process using plasma includes plasma sputtering, radical etching and reactive ion etching. Aspect ratio may be a ratio of height to width. The etching performance of the high aspect ratio hole of the substrate processing apparatus 100, as described below with reference to FIG. 3, may be characterized by eccentricity between a top surface and a bottom surface of the high aspect ratio hole. Here, the eccentricity of the upper surface and the lower surface may be parameterized from misalignment of the center of the upper surface and the center of the lower surface. The eccentricity of the high aspect ratio hole can cause circuit failure due to unintended short or open.

The bottom surface 151B may be closer to the reference surface (for example, the top surface 151T) from the second radius R2 of the internal electrode 151 to a third radius R3 of the internal electrode 151. Here, the third radius R3 may be a radius of the internal electrode 151.

Therefore, the thickness of the internal electrode 151 may decrease from the second radius R2 to the third radius R3. The internal electrode 151 may have a third thickness d3 at the third radius R3. A thickness of a portion of the internal electrode 151 between the second radius R2 and the third radius R3 may be greater than the third thickness d3 and less than the second thickness d2. According to embodiments, the internal electrode 151 may include a protrusion portion PP between first radius R1 to a portion under the third radius R3 which protrudes downward. The apex 151Ap may be a peak point of the protrusion portion PP. In some embodiments, a protrusion is a bump, a hump or a prominence such that a surface extends and then changes direction. In contrast, a flat surface, an angled surface or an oblique surface is a surface with a single tendency.

According to embodiments, a radial variation rate of a profile of the bottom surface 151B from the first radius R1 to the second radius R2 may be less than a radial variation rate of the profile of the bottom surface 151B from the second radius R2 to the third radius R3. According to embodiments, a radial variation rate of a thickness of the internal electrode 151 from the first radius R1 to the second radius R2 may be less than a radial variation rate of a thickness of the internal electrode 151 from the second radius R2 to the third radius R3.

A first inflection point IP1 may be between the center axis CX and the first radius R1, and a second inflection point IP2 may be between the first radius R1 and the second radius R2. Therefore, a portion of the bottom surface 151B between the center axis CX and the first inflection point IP1 may be convex, a portion of the bottom surface 151B between the first inflection point IP1 and the second inflection point IP2 may be concave, and a portion of the bottom surface 151B between the second inflection point IP2 and the third radius R3 may be convex.

A portion, connecting a side surface (the bottom surface 151B) to the top surface 151T, of the internal electrode 151 may contact an inner surface of an external electrode 155. Therefore, an internal radius of the external electrode 155 may also be the third radius R3. A thickness of the internal electrode 151 may be substantially the same as that of the external electrode 155 at a contact surface between the internal electrode 151 and the external electrode 155.

According to embodiments, a top surface 155T of the external electrode 155 may be disposed on substantially the same plane as the top surface 151T of the internal electrode 151. According to embodiments, a bottom surface 155B of the external electrode 155 and the bottom surface 151B of the internal electrode 151 may configure a continuous profile. For example, in some embodiments, there is not a step discontinuity or an abrupt change of direction of the overall surface passing from 151 to 155 (see FIGS. 5B and 5D). Thus the surface, in some embodiments, is continuous without a step and without an abrupt change in direction. Thus the continuous surface is a smooth surface. According to embodiments, a reference voltage GND may be applied to the internal electrode 151 and the external electrode 155, and due to the continuous profile configured by the bottom surface 155B of the external electrode 155 and the bottom surface 151B of the internal electrode 151, a uniformity of an electric field distribution in the plasma region PLR may be enhanced. Accordingly, the reliability of the substrate processing apparatus 100 may be enhanced.

The external electrode 155 may have substantially the same thickness except for a fastening structure for coupling with the shroud 140. The external electrode 155 may overlap at least a portion of the focus ring 135 in the Z direction.

According to embodiments, the center thickness d0 may be greater than the second thickness d2, the second thickness d2 may be greater than the third thickness d3, and the third thickness d3 may be greater than the first thickness d1.

Dimensions of the first to third radiuses R1 to R3, the center thickness d0, and the first to third thicknesses d1 to d3 may be determined based on a radial distribution target of plasma which is set. The dimensions of the first to third radiuses R1 to R3, the center thickness d0, and the first to third thicknesses d1 to d3 may be determined based on a position of a plasma density peak and a radial variation of a plasma density. The dimensions of the first to third radiuses R1 to R3, the center thickness d0, and the first to third thicknesses d1 to d3 may be determined so that a radial non-uniformity of a plasma density is minimized by reducing the plasma density at a center peak and an edge peak of the plasma density. Therefore, a gradient of an etch profile and etching non-uniformity caused by a non-uniform plasma density distribution may be minimized in etching a high aspect ratio hole of the substrate Sb processed by the substrate processing apparatus 100.

Hereinafter, effects of the substrate processing apparatus 100 including the upper electrode 150 according to embodiments will be described in more detail with reference to FIGS. 3 to 4B.

Figure 3:
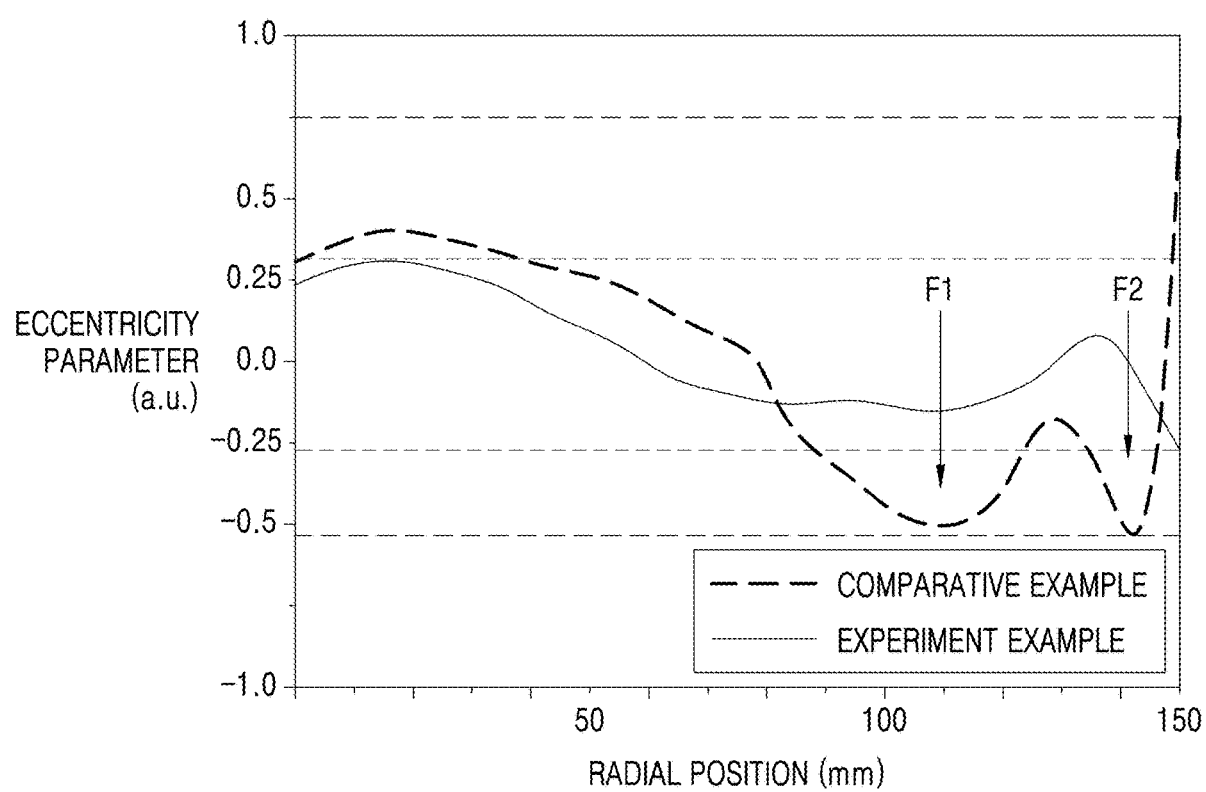
FIGS. 3, 4A and 4B are graphs showing experiment results associated with an experiment example and an experiment result of a comparative example, for showing a comparison of effects of an upper electrode according to embodiments.
Figure 4A:
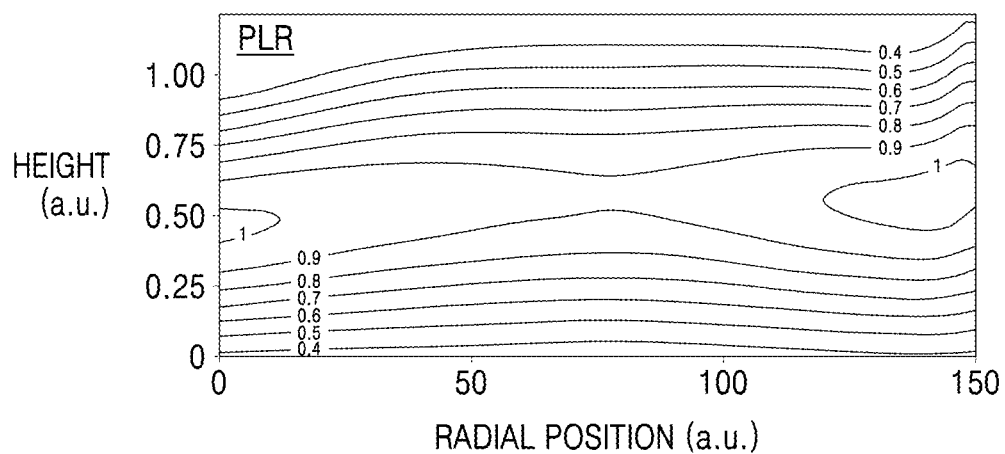
Figure 4B:
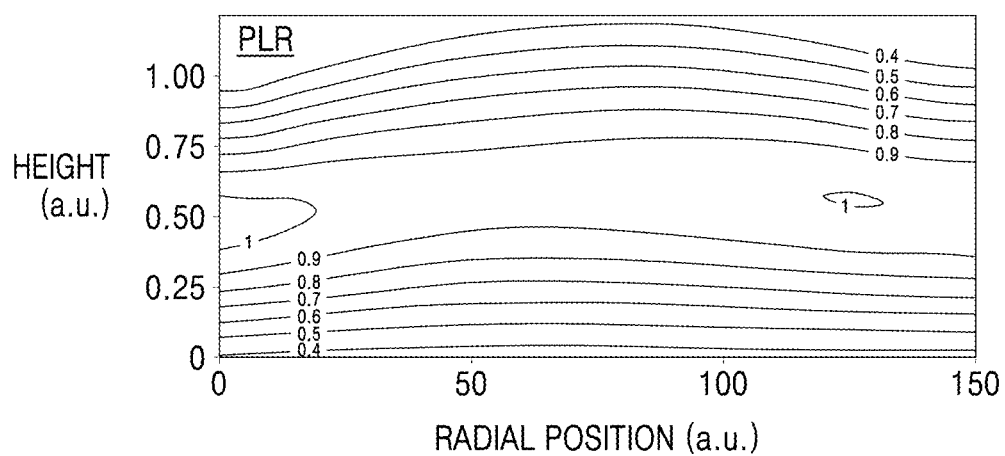

FIGS. 3 to 4B are graphs showing an experiment result of an experiment example and an experiment result of a comparative example, for showing an effect of an upper electrode 150 according to embodiments.

In more detail, FIG. 3 is a graph showing eccentricity of high aspect ratio holes formed by a substrate processing apparatus of an experiment example and eccentricity of high aspect ratio holes formed by a substrate processing apparatus of a comparative example. Also, FIG. 4A is a graph showing a density distribution of plasma of a plasma region PLR (see FIG. 1) generated by the substrate processing apparatus of the comparative example, and FIG. 4B is a graph showing a density distribution of plasma of a plasma region PLR (see FIG. 1) generated by the substrate processing apparatus of the experiment example.

In FIGS. 3 to 4B, an upper electrode included in the substrate processing apparatus of the experiment example is substantially the same as the upper electrode 150 described above with reference to FIGS. 1 and 2, and apex i.e., a point corresponding to the apex 151Ap (see FIG. 1) of an upper electrode included in the substrate processing apparatus of the comparative example is disposed at a radius of about 150 mm.

Referring to FIG. 3, a variation of an eccentricity parameter based on positions of holes having a high aspect ratio formed in a wafer is shown. Here, the eccentricity parameter may be twice a maximum horizontal distance between a center of a bottom surface of a hole and a center of a top surface of the hole. Here, the maximum horizontal distance between the center of the bottom surface of the hole and the center of the top surface of the hole may denote a rectilinear distance between the center of the bottom surface and the center of the top surface orthographic-projected onto the bottom surface. The eccentricity parameter may characterize an degree of ideality of a sidewall profile of each of holes formed by a plasma process. In FIG. 3, the eccentricity parameter is represented by an arbitrary unit (a.u.).

Referring to FIG. 3, the experiment example has an eccentricity characteristic which is more uniform than that of the comparative example. In more detail, in a substrate processed by the substrate processing apparatus of the comparative example, first fluctuation F1 where an eccentricity parameter value increases at a center portion (for example, a position within a radial range of about 90 mm to about 130 mm) of the substrate and second fluctuation F2 where an eccentricity parameter value increases at an edge portion (for example, a position within a radial range of about 130 mm or more) of the substrate have been confirmed.

On the other hand, in a substrate Sb processed by a substrate processing apparatus 100 of the experiment example, it has been confirmed that first and second fluctuations F1 and F2 of an eccentricity parameter occurring in the substrate of the comparative example are removed. Therefore, it has been confirmed that an eccentricity parameter is low and uniform over the entire surface of the substrate Sb processed by the substrate processing apparatus 100 of the experiment example. Particularly, it has been confirmed that a maximum value of an absolute value of an eccentricity parameter in the substrate Sb processed by the substrate processing apparatus 100 of the experiment example is equal to or less than half of an absolute value of an eccentricity parameter in the substrate processed by the substrate processing apparatus of the comparative example. In other words, it has been confirmed that a sidewall profile of a high aspect ratio etch structure of the substrate Sb processed by the substrate processing apparatus 100 of the experiment example is improved.

In an upper electrode of the related art, despite variously changing a form, an increase in an eccentricity parameter of an edge region of a substrate is not prevented. According to embodiments, by providing the upper electrode 150 where the second radius R2 corresponding to a radius of the apex 151Ap ranges from about 150 mm to about 180 mm, a new effect of alleviating or eliminating the abnormalities occurring on the edge of the substrate Sb during the etching process is provided. Accordingly, a yield rate and reliability of semiconductor devices manufactured by the substrate processing apparatus 100 is increased.

Referring to FIGS. 1 to 4B, in the plasma region PLR, it has been confirmed that a plasma density contour according to the experiment example is reduced more in radius-direction variation than a plasma density contour according to the comparative example.

In FIGS. 4A and 4B, the numerical values indicated on the contour lines represent the plasma density at each location in the plasma regions PLR. In FIGS. 4A and 4B, the plasma density is standardized so that its maximum is 1, which is a dimensionless quantity. Each contour is marked with a numerical value indicating a plasma density as at that fixed value along the line marking the contour. Reading the graph to cross lines, is a direction of reading in which plasma density is changing quickly. As described above, the upper electrode 150 may provide the reference voltage, and thus, in FIGS. 4A and 4B, a profile of a 0.4 contour of an uppermost end in a plasma region PLR may have a shape similar to that of a profile of a bottom surface of each of the upper electrode according to the comparative example and the upper electrode 150 according to the experiment example because a shape of the upper electrode according to the comparative example and a shape of the upper electrode 150 according to the experiment example are transferred.

In a vertical center region of the plasma region PLR (i.e., a region near a region where a 0.95 contour extends), it has been confirmed that each of 0.9 contours of FIG. 4B has a radius distribution which is improved to be more uniform than 0.9 contours of FIG. 4A.

Also, it has been confirmed that a 0.4 contour of a lowermost end in the plasma region PLR of FIG. 4B is more uniform than a 0.4 contour of a lowermost end in the plasma region PLR of FIG. 4A. That is, it has been confirmed that a 0.4 contour of a lowermost end in the plasma region PLR of the substrate processing apparatus according to the experiment example is substantially parallel in a radial direction. A 0.4 contour of a lowermost end may be a contour which is the most adjacent to the substrate Sb, and a substantially parallel 0.4 contour implies that plasma treatment is performed over the entire surface of the substrate Sb at the substantially the same plasma density. According to embodiments, a yield rate and reliability of semiconductor devices manufactured by the substrate processing apparatus 100 is increased.

FIGS. 5A to 5D are cross-sectional views for describing upper electrodes 150a, 150b, 150c, and 150d according to other embodiments. In more detail, FIGS. 5A to 5D are partial cross-sectional views corresponding to FIG. 2.

For convenience, descriptions which are the same as or similar to descriptions given above with reference to FIGS. 1 to 4 are omitted, and a difference therebetween will be mainly described below.

Figure 5A:
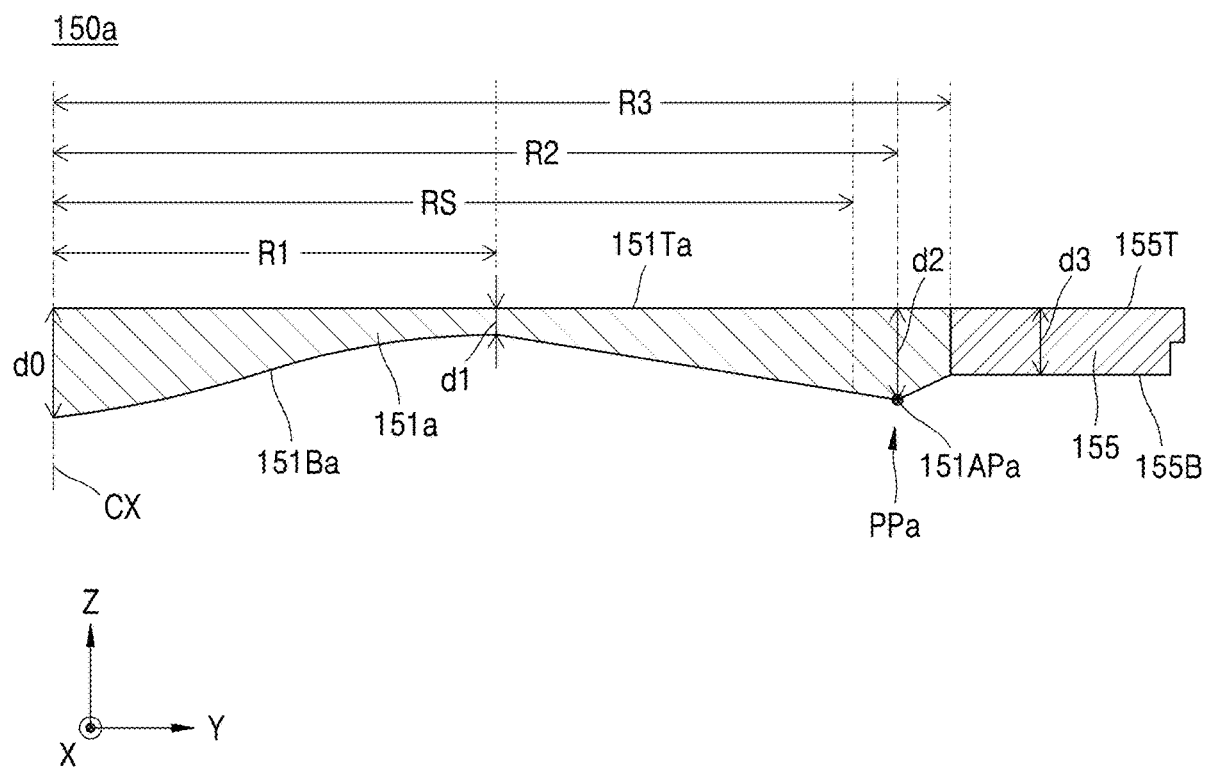
FIGS. 5A, 5B, 5C and 5D are cross-sectional views for describing upper electrodes according to other embodiments.

Referring to FIG. 5A, the upper electrode 150a may include an internal electrode 151a and an external electrode 155. Except for that an apex 151Apa corresponding to a cusp is provided at a protrusion portion PPa of a bottom surface 151Ba, the internal electrode 151a may be similar to the internal electrode 151 of FIG. 2. A top surface 151Ta may be a flat surface like FIG. 2.

According to some embodiments, a thickness of the internal electrode 151a may increase linearly from a first radius R1 to a second radius R2. According to some embodiments, a thickness of the internal electrode 151a may increase linearly from the second radius R2 to a third radius R3. Therefore, a radial gradient of a profile of a bottom surface 151Ba near the apex 151Apa may vary discontinuously.

Figure 5B:
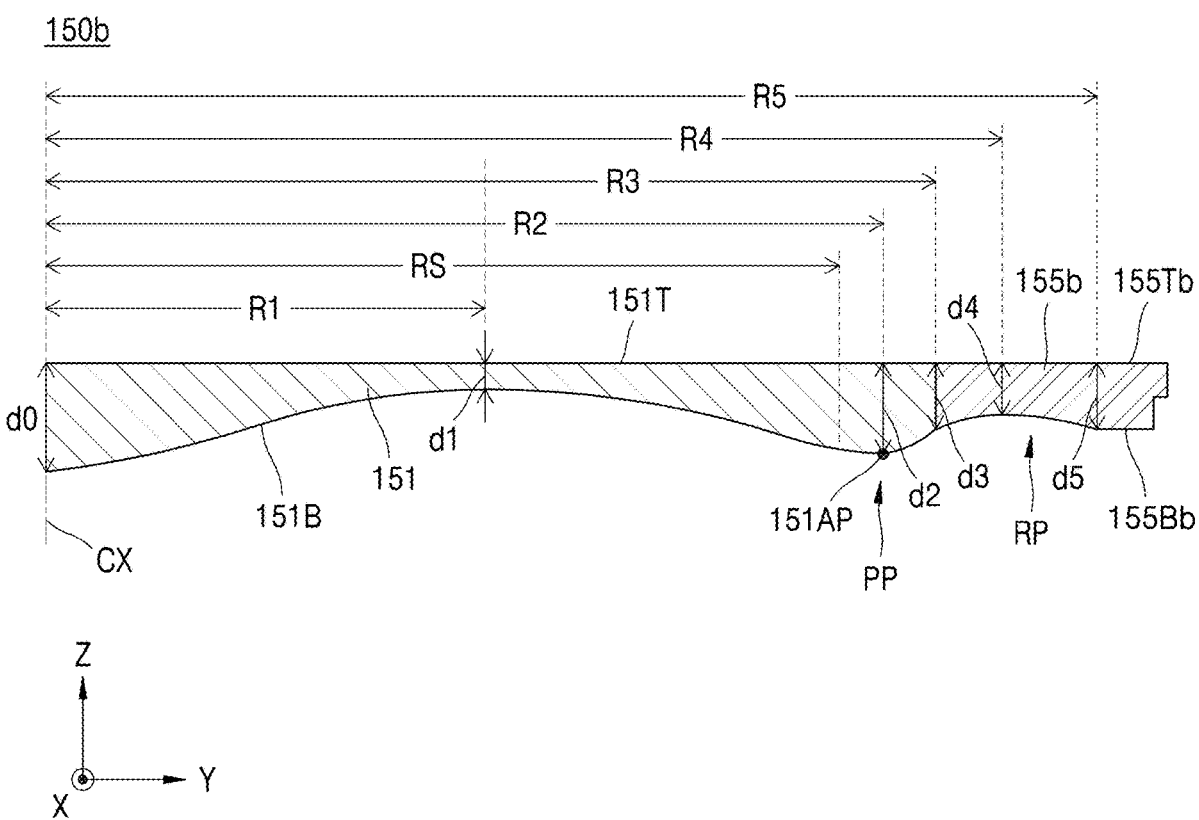

Referring to FIG. 5B, an upper electrode 150b may include an internal electrode 151 and an external electrode 155b. The external electrode 155b may be similar to the external electrode 155 of FIG. 2 and may include a recess portion RP having a structure which is recessed from a bottom surface 155Bb of the external electrode 155b toward a top surface 155Tb of the external electrode 155b.

A distance between the bottom surface 155Bb and the top surface 155Tb of the external electrode 155b may decrease from a third radius R3, which is an internal radius of the external electrode 155b, to a fourth radius R4. Therefore, a thickness of the external electrode 155b may decrease from the third radius R3 to the fourth radius R4. The external electrode 155b may have a fourth thickness d4, which is a minimum thickness at the fourth radius R4. According to embodiments, the fourth thickness d4 may be greater than a first thickness d1 and less than the third thickness d3.

A distance between the bottom surface 155Bb and the top surface 155Tb of the external electrode 155b may increase from the fourth radius R4 to a fifth radius R5. Therefore, a thickness of the external electrode 155b may increase from the fourth radius R4 to the fifth radius R5. The external electrode 155b may have a fifth thickness d5 at the fifth radius R5. Except for a fastening part for a shroud 140 (see FIG. 1), a thickness of the external electrode 155b outside the fifth radius R5 may be the fifth thickness d5 and may be substantially constant. According to embodiments, the fifth thickness d5 may be substantially the same as the third thickness d3, but is not limited thereto.

According to embodiments, an edge peak of a radial distribution of a plasma density may be reduced by the recess portion RP, which at least partially overlaps a focus ring 135 in a Z direction. Therefore, a uniformity of a plasma distribution of a portion corresponding to an edge of a substrate Sb (see FIG. 1) may be enhanced.

Figure 5C:
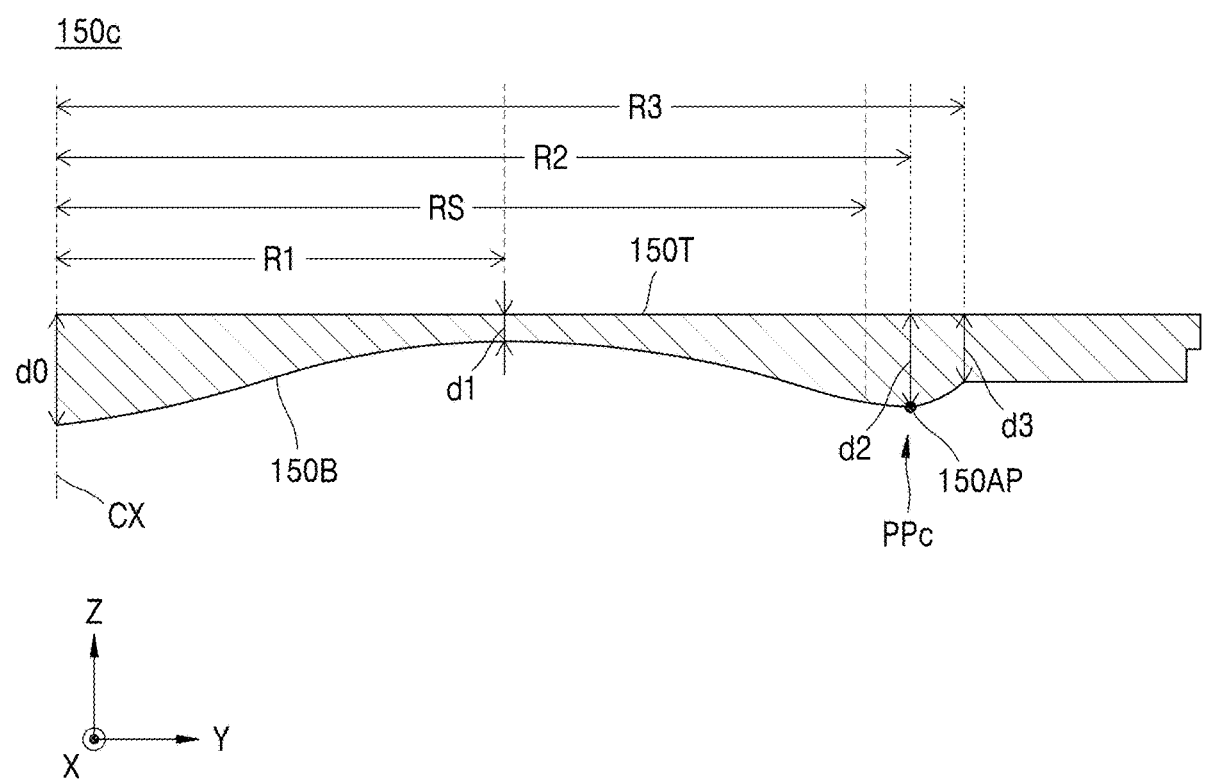

Referring to FIG. 5C, an upper electrode 150c may be similar to the upper electrode 150 of FIG. 2 and may be configured as a single element where the internal electrode 151 and the external electrode 155 of FIG. 2 are provided as one body. Therefore, a bottom surface 150B of the upper electrode 150c may have a shape where the bottom surfaces 151B and 155B of FIG. 2 are provided as one body, and a top surface 155T of the upper electrode 150c may have a shape where the top surfaces 151T and 155T of FIG. 2 are provided as one body. Also, the bottom surface 150B of the upper electrode 150c may include a protrusion portion PPc defined similar to FIG. 2 and an apex 150Ap of the protrusion portion PPc.

According to embodiments, the upper electrode 150c may be provided in a single structure which is electrically continuous, and a uniformity of a reference voltage GND (see FIG. 1) provided by the upper electrode 150c may be enhanced. Accordingly, in a plasma region PLR (see FIG. 1), a uniformity of a plasma distribution of a portion corresponding to an edge of a substrate Sb (see FIG. 1) may be enhanced.

Figure 5D:
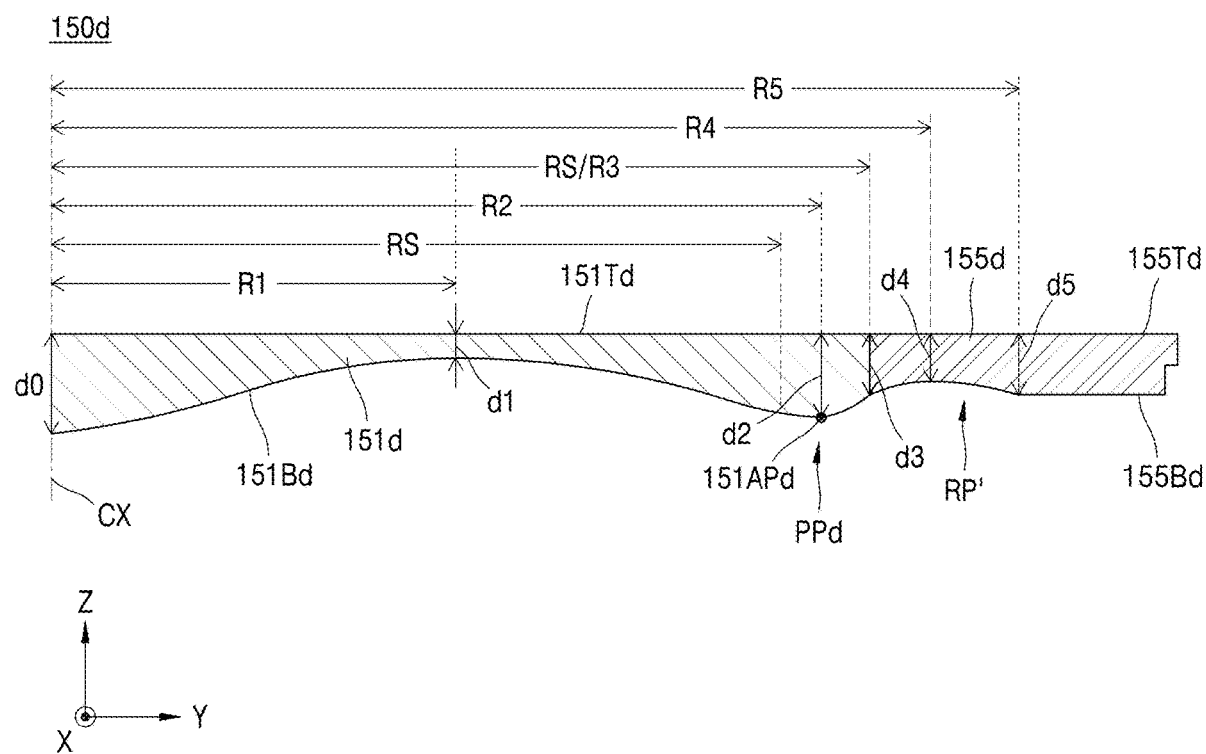

Referring to FIG. 5D, an upper electrode 150d may include an internal electrode 151d and an external electrode 155d. The internal electrode 151d may be similar to the internal electrode 151 of FIG. 2, and a third radius R3, which is a radius of the internal electrode 151d, may be substantially the same as a radius RS of a substrate Sb. Therefore, the internal electrode 151d may not overlap a focus ring 135 (see FIG. 1) in a Z direction. A second radius R2, corresponding to a radial position of an apex 151Apd of a protrusion portion PPd of the internal electrode 151d, may be less than the radius RS of the substrate Sb (see FIG. 1). A top surface 151Td of the internal electrode 151d may be a substantially flat surface like FIG. 2.

The external electrode 155d may be similar to the external electrode 155 of FIG. 2 and may include a recess portion RP' having a structure which is recessed from a bottom surface 155Bd of the external electrode 155d toward a top surface 155Td of the external electrode 155d.

In the embodiment of FIG. 5D, the third radius R3, which is an internal radius of the recess portion RP', and a fifth radius R5, which is an external radius of the recess portion RP', may be the same as an internal radius and an external radius of a focus ring 135 (see FIG. 1), respectively, but are not limited thereto. For example, the third radius R3 may be the same as the internal radius of the focus ring 135 (see FIG. 1), and the fifth radius R5 may be the same as the external radius of the focus ring 135 (see FIG. 1).

According to embodiments, the third radius R3 may be about 150 mm or more, and the fifth radius R5 may be about 210 mm or less. According to embodiments, the fifth radius R5 may be about 180 mm or less.

An edge peak of a radial distribution of a plasma density may be reduced by the recess portion RP', which at least partially overlaps the focus ring 135 in the Z direction. Therefore, in a plasma region PLR (see FIG. 1), a uniformity of a plasma distribution of a portion corresponding to an edge of the substrate Sb (see FIG. 1) may be enhanced.

Figure 6A:
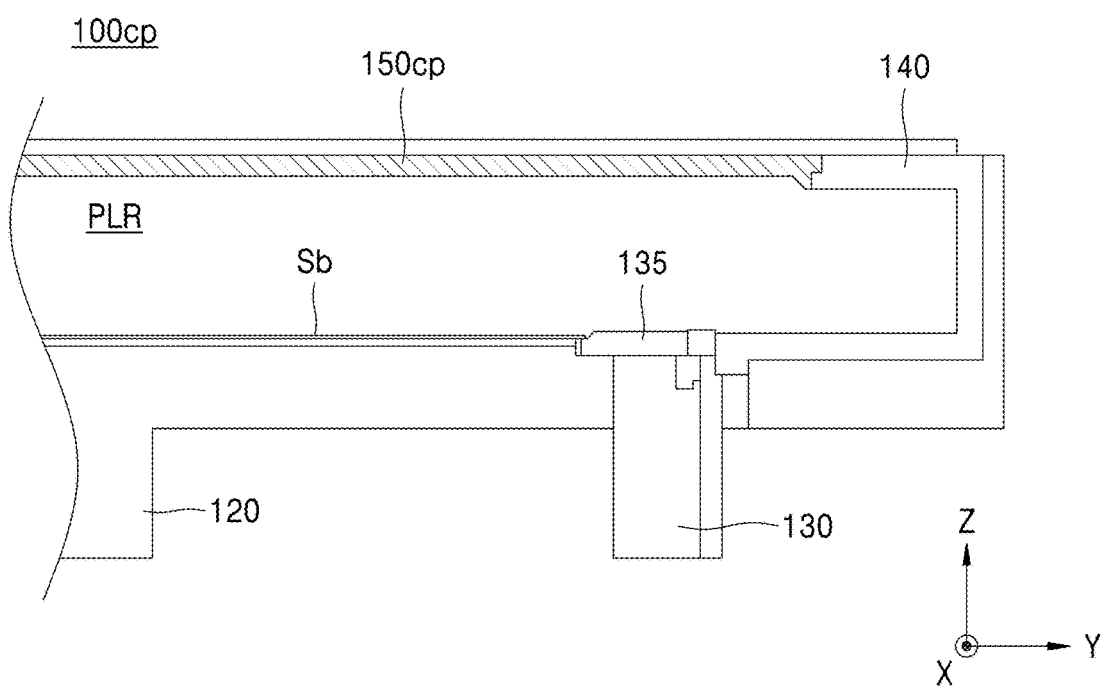
FIG. 6A is a partial cross-sectional view of a substrate processing apparatus of a comparative example.
Figure 6B:
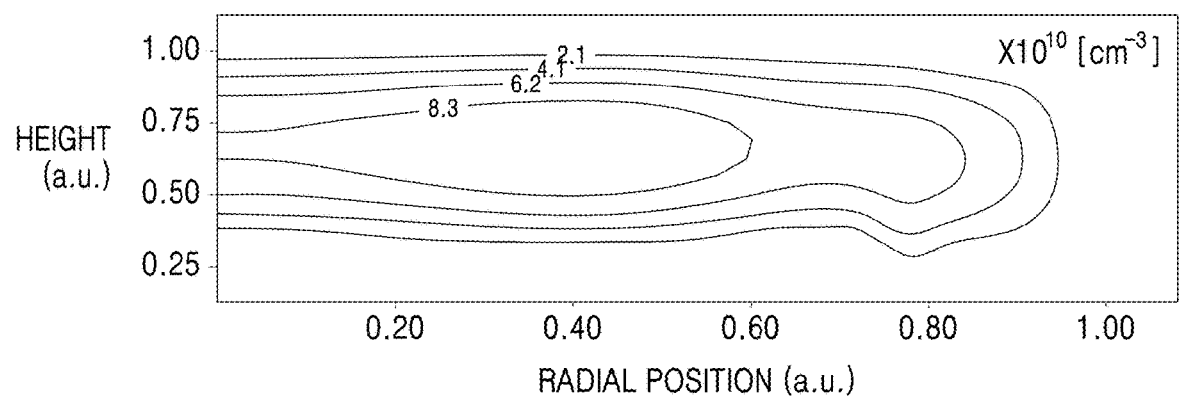
FIG. 6B is a graph showing a contour of a plasma density of a plasma region in the substrate processing apparatus of the comparative example.

FIG. 6A is a partial cross-sectional view of a substrate processing apparatus 100cp of a comparative example, and FIG. 6B is a graph showing a contour of a plasma density of a plasma region PLR in a substrate processing apparatus of the related art. In FIG. 6B, a radial position of the abscissa axis and a height from a substrate of the ordinate axis are each represented by an arbitrary unit (a.u.).

Referring to FIGS. 6A and 6B, the substrate processing apparatus 100cp of the comparative example may include a substrate supporter 120, a focus ring supporter 130, a focus ring 135, a shroud 140, and an upper electrode 150cp. The upper electrode 150cp may include a bottom surface which is a substantially planar surface. In the substrate processing apparatus 100cp of the comparative example, it has been confirmed that a radial variation of a density of plasma generated near an edge of a substrate Sb is large. Plasma generated within a radius range of about 150 mm to about 180 mm may affect a portion near the edge of the substrate Sb. In the comparative example, it has been confirmed that a uniformity of a plasma process near the edge of the substrate Sb is reduced due to a radial variation of a density of plasma generated within a radius range of about 150 mm to about 180 mm.

Figure 7A:
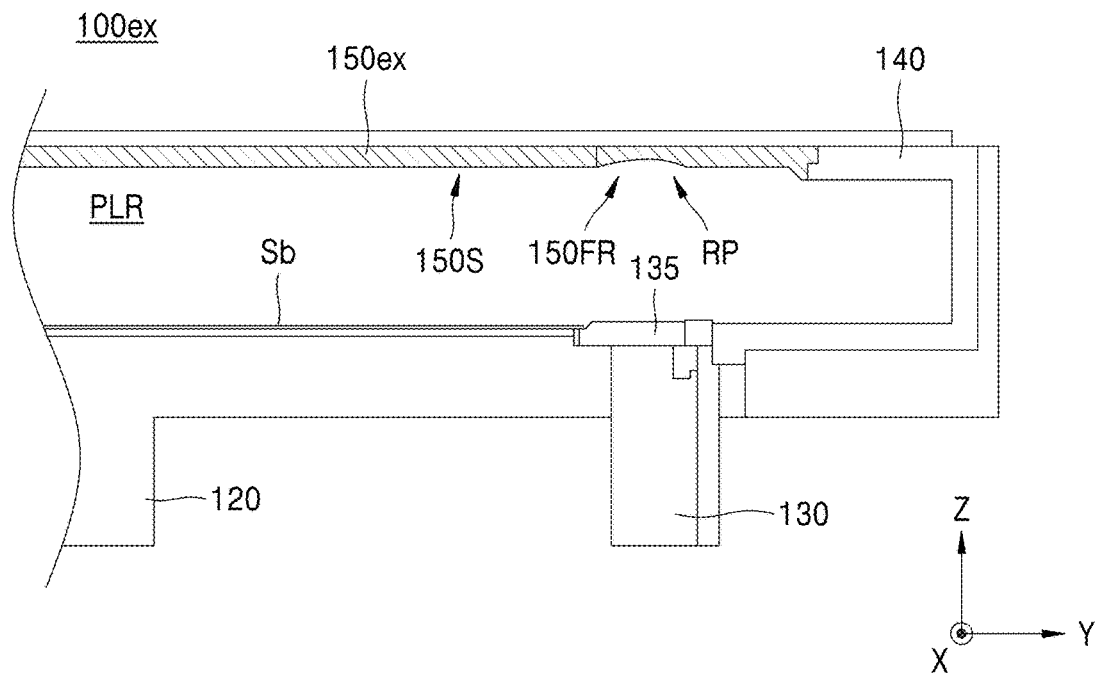
FIG. 7A is a partial cross-sectional view of a substrate processing apparatus of an experiment example.
Figure 7B:
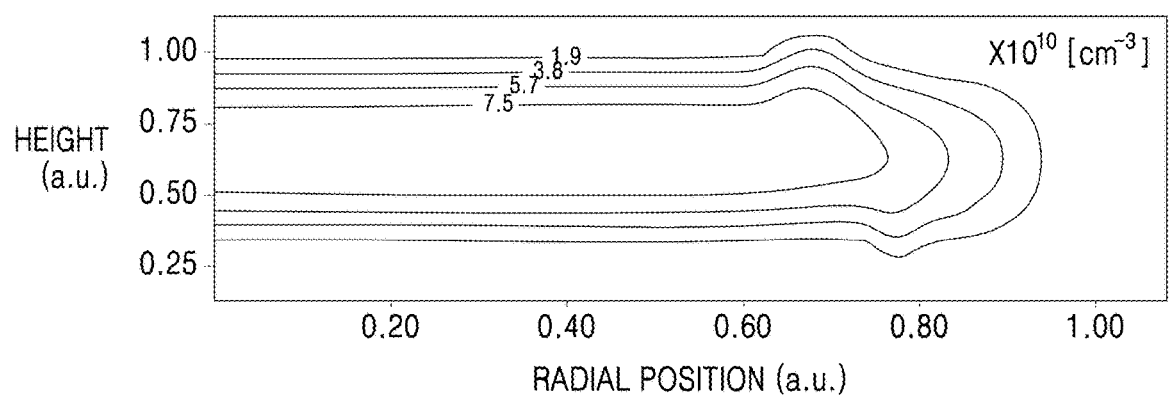
FIG. 7B is a graph showing a contour of a plasma density of a plasma region in the substrate processing apparatus of the experiment example.

FIG. 7A is a partial cross-sectional view of a substrate processing apparatus 100ex of an experiment example, and FIG. 7B is a graph showing a contour of a plasma density of a plasma region PLR in the substrate processing apparatus 100ex of the experiment example. In FIG. 7B, a radial position of the abscissa axis and a height from a substrate of the ordinate axis are each represented by an arbitrary unit (a.u.).

Referring to FIGS. 7A and 7B, the substrate processing apparatus 100ex may include a substrate supporter 120, a focus ring supporter 130, a focus ring 135, a shroud 140, and an upper electrode 150ex. The upper electrode 150ex may include a substrate facing portion 150S including a bottom surface which is a substantially planar surface and a focus ring facing portion 150FR where a recess portion RP is provided. It has been confirmed that, in a contour of a density of plasma generated by the substrate processing apparatus 100ex of the experiment example, a radial variation is reduced compared to the contour of FIG. 6B. Particularly, it has been confirmed that a non-uniformity of a plasma concentration of a portion with horizontal distance from the center of plasma region ranging from about 150 mm to about 180 mm affecting a etching of a portion near an edge of a substrate Sb is largely reduced.

Figure 8:
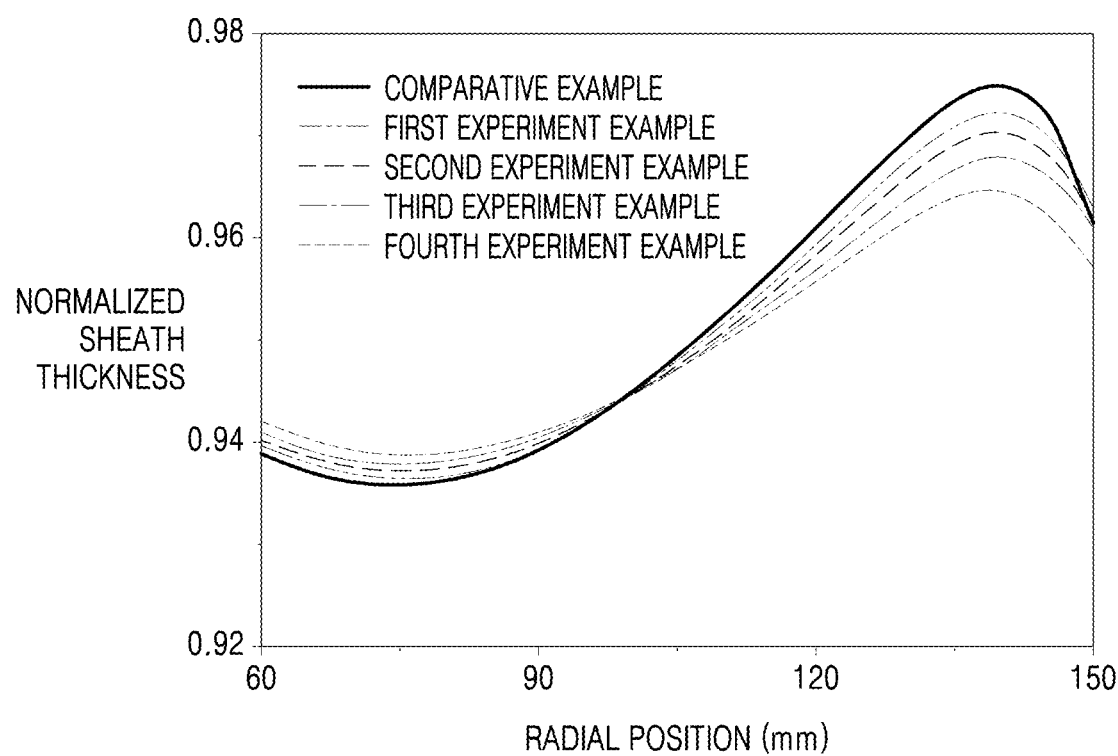
FIGS. 8 and 9 are graphs for describing effects of upper electrodes according to embodiments.
Figure 9:
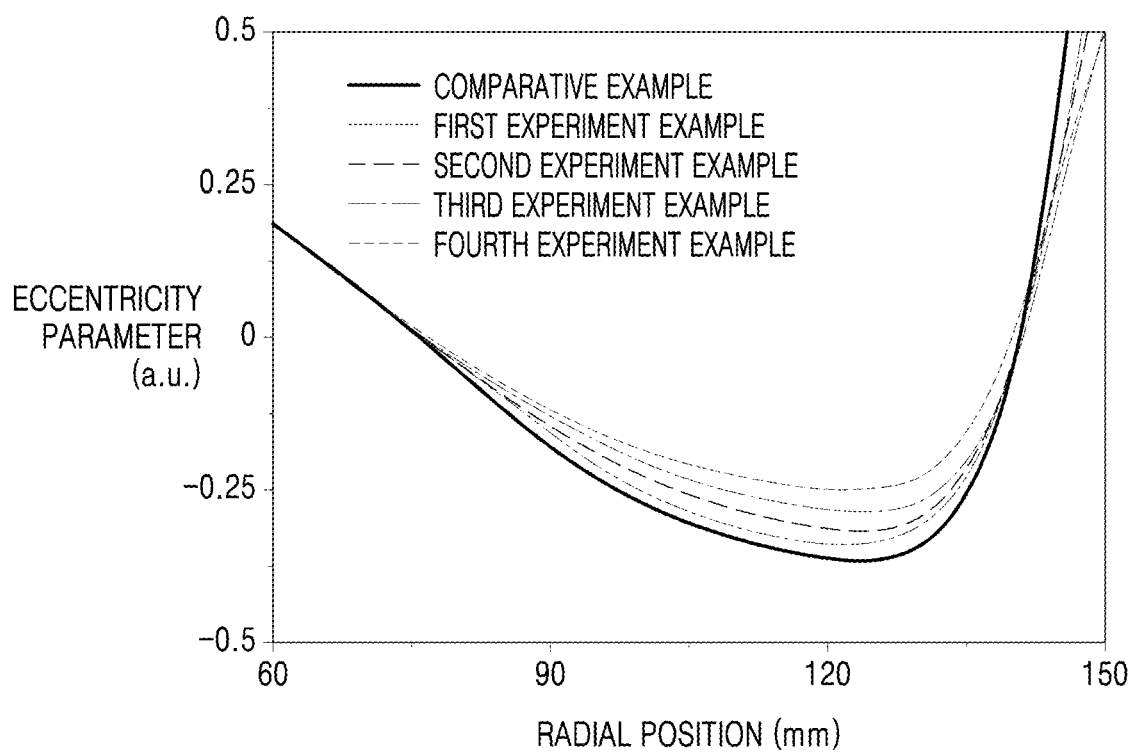

FIGS. 8 and 9 are graphs for describing effects of upper electrodes according to embodiments.

In FIGS. 8 and 9, in a comparative example, as in FIG. 6A, an upper electrode 150cp may include a flat bottom surface, and a recess portion may not be provided at a portion facing a focus ring 135 of the upper electrode 150cp. In first to fourth experiment examples, as in FIG. 7A, an upper electrode 150ex may include a focus ring 150FR where a recess portion RP is provided. In first to fourth experiment examples, a depth of the recess portion RP may increase in order.

Referring to FIG. 8, comparing with a comparative example, it has been confirmed that a uniformity of a sheath thickness is enhanced in the first to fourth experiment examples. As described above, a variation of a sheath thickness may cause eccentricity in forming a high aspect ratio hole, and thus, by enhancing a uniformity of a sheath thickness, a uniformity of plasma treatment may also be enhanced. Also, in the first to fourth experiment examples, it has been confirmed that a recess portion having a large depth within a predetermined range is provided, and thus, a uniformity of a plasma sheath is enhanced.

FIG. 9 shows an eccentricity parameter of patterns formed at an edge of each of substrates processed by the comparative example and the first to fourth experiment examples.

Referring to FIG. 9, it has been confirmed that an eccentricity parameter of an edge of each of substrates processed by the first to fourth experiment examples is lower than the comparative example. It has been confirmed that a recess portion having a large depth within a predetermined range is provided based on an eccentricity parameter of each of the first to fourth experiment examples, and thus, the etching performance of a substrate processing apparatus is enhanced.

While embodiments have been shown and described with reference to embodiments thereof, it will be understood that various changes in form and details may be made therein without departing from the spirit and scope of the following claims.

What is claimed is:

1. An upper electrode used for a substrate processing apparatus using plasma, the upper electrode comprising:
    a bottom surface including a center region and an edge region, the edge region having a ring shape and surrounding the center region; and
    a first protrusion portion protruding toward the plasma from the edge region and having a ring shape,
    wherein the first protrusion portion comprises a first apex corresponding to a local maximum thickness of the upper electrode in a vertical direction toward the plasma, the bottom surface configured to face a substrate with the plasma between, and
    a first distance, which is a first radial-direction distance between the first apex and a center axis of the upper electrode, is greater than a radius of the substrate.

2. The upper electrode of claim 1, wherein the first distance is a distance between the first apex and the center axis, and the first distance is greater than the radius of the substrate and less than or equal to 1.2 times the radius of the substrate.

3. The upper electrode of claim 1, wherein the first distance is within a range beginning at and including 150 mm and extending to and including 180 mm.

4. The upper electrode of claim 1, wherein the first distance is within a range beginning at and including 160 mm and extending to and including 175 mm.

5. The upper electrode of claim 1, wherein the center region and the edge region of the bottom surface are characterized by a continuous surface which is a smooth surface.

6. The upper electrode of claim 1, wherein a thickness of the center region of the bottom surface varies with radial position, the radial position taken with respect to the center axis.

7. The upper electrode of claim 1, wherein the first apex has a ring shape and the first distance is a radius of the ring shape.

8. The upper electrode of claim 1, further comprising a recess portion in the edge region of the bottom surface, wherein a recess of the recess portion is in a direction from the bottom surface of the upper electrode toward a top surface of the upper electrode.

9. The upper electrode of claim 8, wherein a second radial-direction distance between a minimum thickness of the recess portion and the center axis is greater than the first distance.

10. The upper electrode of claim 1, wherein a portion of the upper electrode, which is between the first distance and a second distance which is greater than the first distance, has a thickness which decreases with increasing radial distance from the center axis.

11. The upper electrode of claim 10, wherein the second distance is equal to or less than 1.2 times the radius of the substrate.

12. The upper electrode of claim 10, wherein the second distance is 180 mm or less.

13. An upper electrode used for a substrate processing apparatus, the upper electrode comprising a bottom surface configured to face a substrate processed by the substrate processing apparatus,
    wherein the bottom surface comprises a first protrusion portion having a ring shape,
    the first protrusion portion comprises a first apex corresponding to a local maximum thickness of the upper electrode in a vertical direction, the bottom surface facing the substrate, and a first distance, which is a distance between the first apex and a center axis of the upper electrode, is beginning at and including 150 mm and extending to and including 180 mm.

14. The upper electrode of claim 13, wherein the first distance is 160 mm or more.

15. The upper electrode of claim 13, wherein the first distance is 175 mm or less.

16. The upper electrode of claim 13, wherein the upper electrode has rotational symmetry with respect to the center axis, and the first distance is greater than a radius of the substrate.

17. An upper electrode used for a substrate processing apparatus, the upper electrode comprising:

a first portion configured to face a substrate; and a second portion configured to face a focus ring, the second portion surrounding the first portion, wherein the second portion is recessed in a direction from a bottom surface of the upper electrode toward a top surface of the upper electrode, the second portion comprises a ring-shaped portion surrounding the first portion, the second portion has a first thickness at an internal radius of the second portion, the second portion has a second thickness at an external radius of the second portion, and a third thickness between the internal radius and the external radius of the second portion is less than each of the first thickness and the second thickness.

18. The upper electrode of claim 17, wherein the second portion comprises a ring-shaped portion surrounding the first portion, and an internal radius of the second portion is 150 mm or more, and an external radius of the second portion is 210 mm or less.

19. The upper electrode of claim 17, wherein a single structure comprises the first portion and the second portion such that the single structure is electrically continuous, the second portion comprises a ring-shaped portion surrounding the first portion.

* * * * *